US005322605A

United States Patent [19]
Yamanishi

[11] Patent Number: 5,322,605
[45] Date of Patent: Jun. 21, 1994

[54] REACTIVE SPUTTERING APPARATUS

[75] Inventor: Hitoshi Yamanishi, Higashiosaka, Japan

[73] Assignee: Matsushita Electric Industrial Co., Ltd., Osaka, Japan

[21] Appl. No.: 942,827

[22] Filed: Sep. 10, 1992

[30] Foreign Application Priority Data

Sep. 10, 1991 [JP] Japan .................... 3-229987

[51] Int. Cl.⁵ .............................. C23C 14/35
[52] U.S. Cl. ..................... 204/298.07; 204/298.19
[58] Field of Search .............. 204/298.07, 298.19

[56] References Cited

U.S. PATENT DOCUMENTS 4,428,812 1/1984 Sproul .................. 204/192.15
4,572,842 2/1986 Dietrich et al. ............. 427/571

FOREIGN PATENT DOCUMENTS 150480 9/1981 Fed. Rep. of Germany ................ 204/298.07

Primary Examiner—Aaron Weisstuch
Attorney, Agent, or Firm—Wenderoth, Lind & Ponack

[57] ABSTRACT

A reactive sputtering apparatus includes a vacuum chamber, a cathode fixed to an inner surface of the chamber, a power source for applying a voltage to the cathode, a magnetic circuit, installed in the cathode and having magnets for generating a magnetic field, a target, installed adjacent the magnets, having an opening at a portion corresponding to a region between the magnets of the magnetic circuit, a vacuum device for evacuating air inside the chamber to obtain vacuum, a first gas-introducing device, disposed at a wall of the chamber, for supplying reactive gas into the chamber, a second gas-introducing device for supplying discharge gas from the opening of the target into the chamber, a first gas flow rate control device for controlling the supply of the reactive gas, a second gas flow rate control device for controlling the supply of the discharge gas, and a substrate holder, disposed in opposition to the target inside the chamber, for securing a substrate thereto.

20 Claims, 4 Drawing Sheets

REACTIVE SPUTTERING APPARATUS

BACKGROUND OF THE INVENTION

The present invention relates to a reactive sputtering apparatus to be used in the process of manufacturing an object such as a semiconductor or an electronic component.

In a reactive sputtering apparatus, reactive gas such as nitrogen gas is added to a discharge gas such as argon gas used in a normal sputtering apparatus so as to deposit a compound, formed by the reaction of the reactive gas with particles sputtered from the material of a target, in the form of a thin film on a substrate.

Since a reactive sputtering apparatus is capable of easily forming various kinds of thin films merely by introducing reactive gas into a normal sputtering apparatus, the reactive sputtering apparatus is preferably used in the process of manufacturing a semiconductor or an electronic component.

An example of a conventional reactive sputtering apparatus is described below with reference to FIG. 6.

The reactive sputtering apparatus comprises a vacuum chamber 1; a vacuum discharge opening 2 for evacuating air from the chamber 1; a gas-introducing pipe 3 for supplying discharge gas 5 and reactive gas 6 into the chamber 1; a gas flow rate controller 4 for controlling the flow rate of the discharge gas 5 and the reactive gas 6; a target 7 mounted on a cathode 8; a power source 9 for applying a voltage to the cathode 8 fixed to the inner surface of the chamber 1; a magnetic circuit 10, mounted in the cathode 8 and having a center circular magnet 10a and an annular magnet 10b, for generating a magnetic field; a substrate holder 11 to which a substrate 12 is secured; and an erosion region 13, of the target 7, in which plasma density is highest during magnetron discharge. The erosion region 13 is located between the magnets 10a and 10b. The target 7 is located below the magnets 10a and 10b in the cathode 8.

The operation of the reactive sputtering apparatus of the above-described construction will now be described below with reference to FIG. 6. First, air is evacuated from the chamber 1 by a vacuum pump (P) through the vacuum opening 2 to a degree of vacuum as high as approximately $10^{-7}$ Torr. The discharge gas 5 and the reactive gas 6 are introduced into the chamber 1 through the gas-introducing pipe 3 connected with the chamber 1, with the quantity of the discharge gas 5 and the reactive gas 6 being controlled by the gas flow rate controller 4.

The pressure inside the chamber 1 is kept at $10^{-3}$ to $10^{-2}$ Torr. A negative voltage is applied by the power source 9 to the magnetron cathode 8. Plasma is generated by magnetron discharge in the vicinity of the surface of the target 7 under the action of a magnetic field generated by the magnetic circuit 10 disposed inside the cathode 8 and that of an electric field generated by the power source 9. A compound formed as a result of the reaction of particles sputtered from the target 7 with the reactive gas 6 is deposited in the form of a thin film on the substrate 12 fixed to the substrate holder 11.

It is known that sputtered particles and the reactive gas 6 react with each other mainly on the substrate 12.

According to the conventional reactive sputtering apparatus, the discharge gas and the reactive gas are supplied into the chamber through the same gas-introducing pipe. As a result, the reactive gas exists not only in the vicinity of the substrate 12 but also in the erosion region of the target in which plasma density is highest in magnetron discharge. Consequently, a compound formed as a result of the reaction of the material of the target with the reactive gas deposits on the surface of the target. The compound greatly prevents particles from being sputtered from the target. Therefore, the thin film is formed on the substrate at a speed of ⅓ to 1/5 the speed at which a thin film is formed by a normal sputtering apparatus.

SUMMARY OF THE INVENTION

It is an object of the present invention to provide a reactive sputtering apparatus which forms a thin film on a substrate without lowering the formation speed of the thin film.

In accomplishing these and other objects, according to one aspect of the present invention, there is provided a reactive sputtering apparatus comprising:

a chamber;

a cathode fixed to an inner surface of the chamber;

a power source for applying a voltage to the cathode;

a magnetic circuit, installed in the cathode and having magnets, for generating a magnetic field;

a target, installed adjacent the magnets, having at least one opening at a portion corresponding to a region between the magnets of the magnetic circuit;

a vacuum means for evacuating air inside the chamber to obtain vacuum;

a first gas-introducing means, disposed at a wall of the chamber, for supplying reactive gas into the chamber;

a second gas-introducing means for supplying discharge gas from the opening of the target into the chamber;

a first gas flow rate control means for controlling the supply of the reactive gas;

a second gas flow rate control means for controlling the supply of the discharge gas; and a substrate holder, disposed in opposition to the target inside the chamber, for securing a substrate thereto.

According to the above-described construction, since the discharge gas is supplied to the chamber through the second gas-introducing means and the reactive gas is supplied thereto through the first gas-introducing means, the gas which contributes to plasma formed in the vicinity of the surface of the target by magnetron discharge consists mostly of the discharge gas. As a result, the reaction of the reactive gas with the material of the target occurs at a decreased rate and thus a resulting compound is formed on the surface of the target in a reduced rate. Accordingly, a compound formed by the reaction of particles sputtered from the target with the reactive gas can be deposited on the substrate as a thin film without lowering the film-forming speed, unlike the conventional art.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
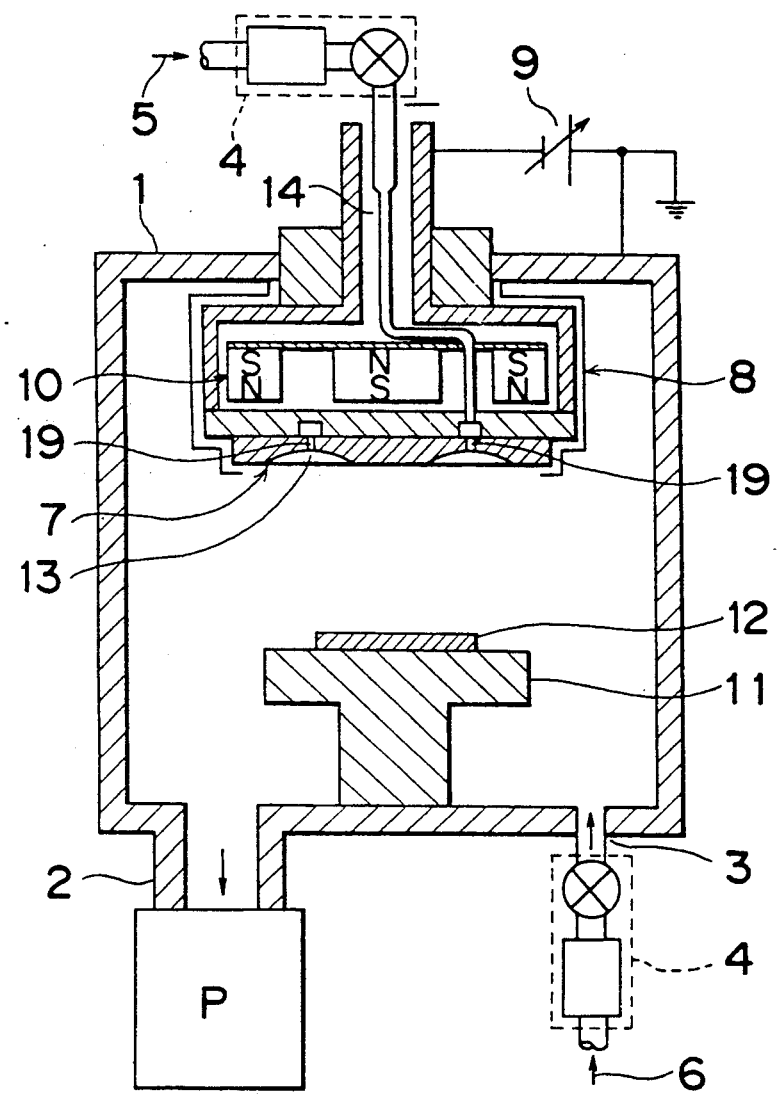
FIG. 1 is a view showing the construction of a reactive sputtering apparatus according to a first embodiment of the present invention.

Before the description of the present invention proceeds, it is to be noted that like parts are designated by like reference numerals throughout the accompanying drawings.

A reactive sputtering apparatus according to a first embodiment of the present invention is described below with reference to FIGS. 1 through 3.

FIG. 1 is a sectional view showing the reactive sputtering apparatus according to the first embodiment. Parts having the same functions as the parts of the conventional reactive sputtering apparatus are each denoted by the same reference numeral and the descriptions thereof are omitted. The construction of the reactive sputtering apparatus according to the first embodiment is different from that of the conventional one in that a plurality of small openings 19 is formed through the target 7 made of metal such as titanium. The openings 19 are circularly arranged and a gas-introducing pipe 14 for introducing the discharge gas into the chamber 1 is provided and connected with the small openings 19 of the target 7.

Figure 2:
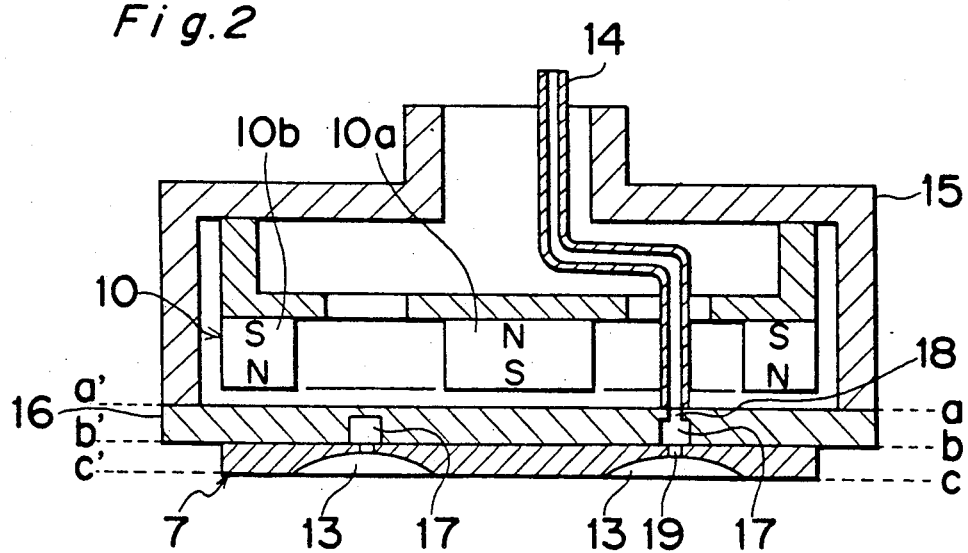
FIG. 2 is a sectional view showing a cathode of the reactive sputtering apparatus of FIG. 1.
Figure 3A:
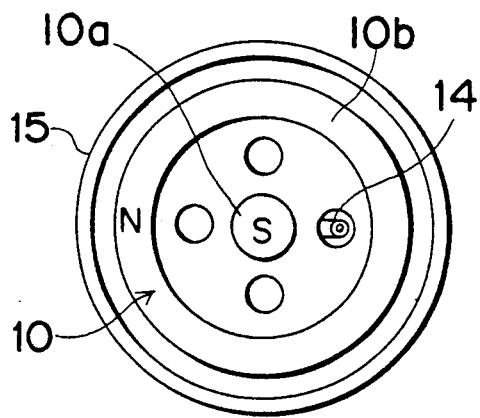
FIG. 3A is a sectional view taken along a line a—a' of FIG. 2.
Figure 3B:
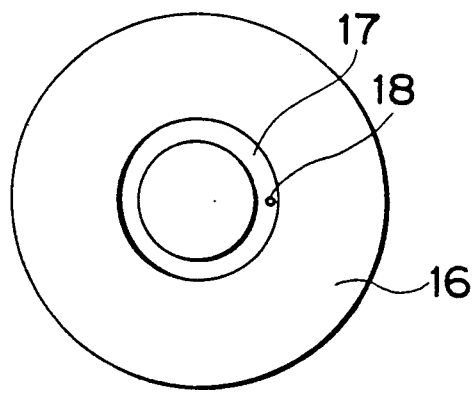
FIG. 3B is a sectional view taken along a line b—b' of FIG. 2.
Figure 3C:
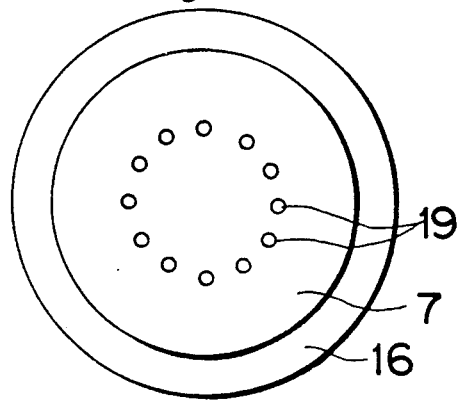
FIG. 3C is a sectional view taken along a line c—c' of FIG. 2.

FIG. 2 is a partial sectional view showing the cathode portion of the reactive sputtering apparatus of FIG. 1. FIGS. 3A through 3C are sectional views taken along lines a—a', b—b', and c—c', of FIG. 2, respectively.

Referring to FIGS. 2 and 3A-3C, the main body 15 of the cathode 8 accommodates the magnetic circuit 10 for generating magnetron discharge. The magnetic circuit 10 includes the center circular magnet 10a and the annular magnet 10b surrounding the magnet 10a through an annular space thereon. Those magnets 10a and 10b are coaxially arranged. A backing plate 16 on which the target 7 is disposed has therein an annular slit, namely, an annular groove 17 formed coaxially therewith. A small gasintroducing opening 18 is formed into a certain depth from the surface of the backing plate 16 opposite to the surface to which the target 7 is fixed. The small gas-introducing opening 18 communicates with the annular groove 17 and connects the annular groove 17 18 with the gasintroducing pipe 14.

The plurality of small gas blowoff openings 19 is formed in the erosion region 13 of the target 7 by soldering the target 7 onto the backing plate 16 by means of indium. The erosion region 13 is located between the magnets 10a and 10b.

More specifically, as shown in FIGS. 1 and 2, the openings 19 are formed in the target 7 at the center of the erosion region 13. Since the center of the erosion region 13 naturally is aligned with the portion of the magnetic field having a maximum component parallel to the target (and thus no component normal to the target), it follows that the openings 19 are aligned with the portion of the magnetic field having a maximum component parallel with the target 7.

The operation of the reactive sputtering apparatus of the above-described construction is described below.

First, air is discharged from the chamber 1 through the vacuum opening 2 by the vacuum pump (P) to a degree of vacuum as high as approximately $10^{31\ 7}$ Torr.

Then, discharge gas 5, such as argon gas at 100 ccm is supplied to the chamber 1 through the gasintroducing pipe 14, the small gas-introducing opening 18, the annular groove 17 of the backing plate 16, the small gas blowoff openings 19 of the target 7 and the erosion region 13 of the target 7.

Reactive gas 6, such as nitrogen gas of 50 ccm, is supplied to the chamber 1 through the gas-introducing pipe 3.

The pressure inside the chamber 1 is kept at $10^{-3}$ to $10^{-2}$ Torr. The flow rate of each gas is controlled by each gas flow rate controller 4.

A negative voltage is applied by the power source 9 to the magnetron cathode 8. Plasma is generated by magnetron discharge in the vicinity of the surface of the target 7 under the action of a magnetic field generated by the magnetic circuit 10 disposed inside the cathode 8 and that of an electric field generated by the power source 9. Since the discharge gas 5 is supplied into the chamber 1 via the erosion region 13 of the target 7 in this embodiment, the discharge gas 5 mainly exists in the vicinity of the surface of the target 7. That is, the gas which contributes to plasma formed in the vicinity of the surface of the target 7 by magnetron discharge consists mostly of the discharge gas 5.

Since the reactive gas 6 exists not in the vicinity of the target 7 but in other regions, it is difficult for the reaction of the reactive gas 6 with the material of the target 7 to occur and thus a resulting compound is formed on the surface of the target 7 at a reduced rate. Accordingly, particles can be easily sputtered from the material of the target 7.

Therefore, a compound formed by the reaction of sputtered particles with the reactive gas 6 can be deposited on the substrate 12 as a thin film without lowering the formation speed of the thin film.

Figure 3D:
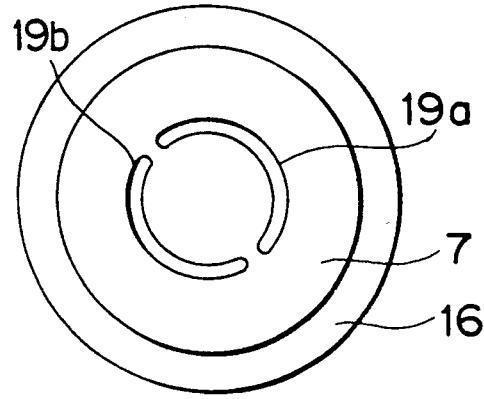
FIG. 3D is a sectional view showing a modification of FIG. 3C.

In the first embodiment, the number of openings 19 may be more than or equal to one. For example, the target 7 may have two small substantially semi-annular gas blowoff openings 19a and 19b as shown in FIG. 3D; or may have a plurality of openings arranged in an annular pattern as shown in FIGS. 3A and 3C; or may have a single annular opening as shown in FIG. 3B.

Figure 5:
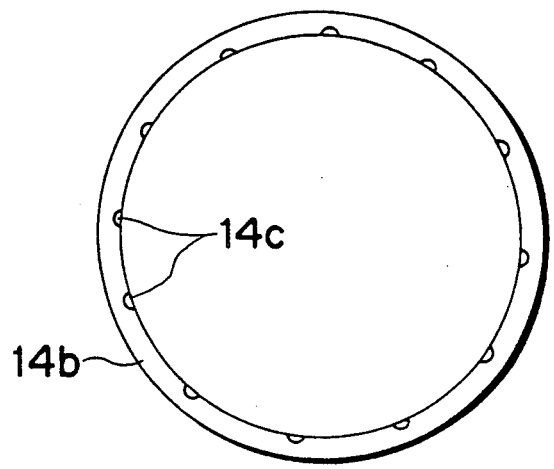
FIG. 5 is a sectional view showing a circular gas feeding pipe of the reactive sputtering apparatus of FIG. 4.
Figure 4:
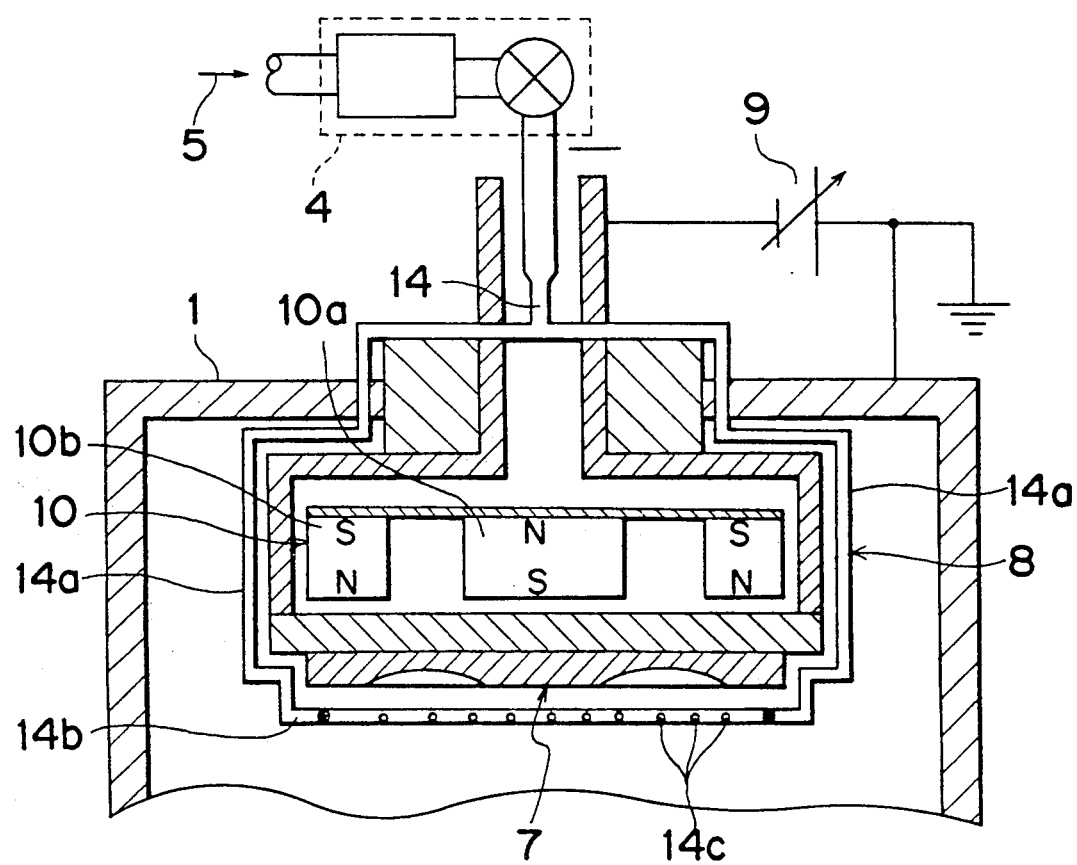
FIG. 4 is an enlarged view showing the partial construction of a reactive sputtering apparatus according to a second embodiment of the present invention.
Figure 6:
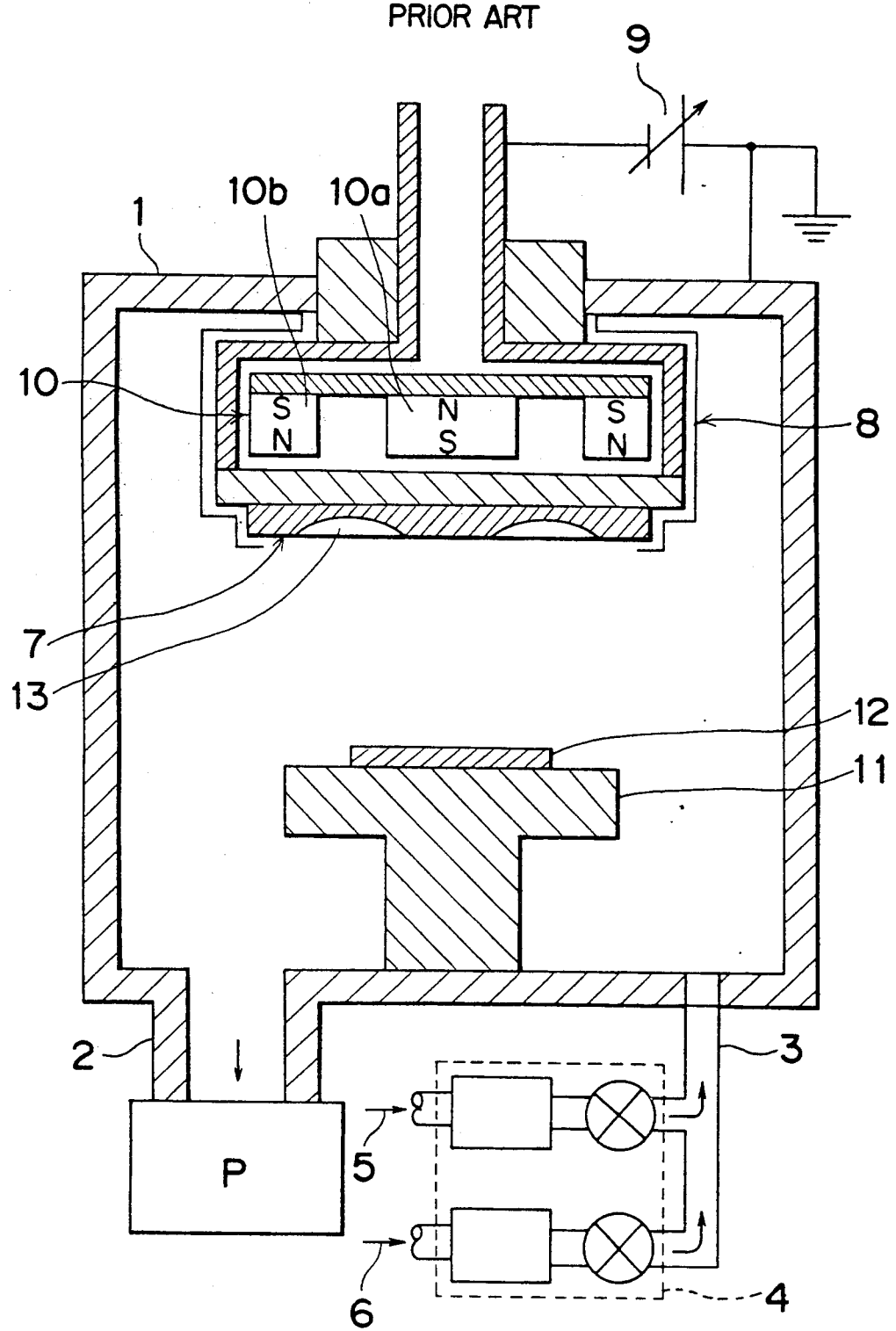
FIG. 6 is a conventional reactive sputtering apparatus.

A second embodiment of the present invention is described below. In the second embodiment, the gasintroducing pipe 14 communicates with a circular pipe 14b disposed outside the cathode 8 through pipes 14a as shown in FIGS. 4 and 5. The circular pipe 14b is disposed at the periphery of the circular target 7 and has a plurality of openings 14c to supply the discharge gas 5 from the periphery of the target 7 in the chamber 1. The second embodiment also can obtain the same advantages as the first embodiment.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A reactive sputtering apparatus comprising:
   a vacuum chamber;
   a cathode fixed to an inner surface of the chamber;
   a power source for applying a voltage to the cathode;
   a magnetic circuit, installed in the cathode and having magnets arranged in a first plane, for generating a magnetic field;
   a target, installed adjacent the magnets and along a second plane parallel with said first plane, having at least one opening therethrough at a predetermined location, said predetermined location of said at least one opening being aligned, along a direction normal to said first and second planes, with a portion of said magnetic field which has a maximum component in a direction parallel to said first and second planes and no component in said direction normal to said first and second planes;
   a vacuum means for evacuating air from inside the chamber to obtain a vacuum;
   a first gas-introduced means, disposed at a wall of the chamber, for supplying reactive gas into the chamber;
   a second gas-introducing means for supplying discharge gas through said at least one opening of the target into the chamber;
   a first gas flow rate control means for controlling the supply of the reactive gas;
   a second gas flow rate control means for controlling the supply of the discharge gas; and
   a substrate holder, disposed in opposition to the target inside the chamber, for securing a substrate thereto.

2. The reactive sputtering apparatus as claimed in claim 1, wherein the target has a plurality of openings, each of which is at a location aligned, along a direction normal to said first and second planes, with a portion of said magnetic field having a maximum component in a direction parallel to said first and second planes and no component in said direction normal to said first and second planes.

3. The reactive sputtering apparatus as claimed in claim 1, wherein the magnets of the magnetic circuit are coaxial with one another.

4. The reactive sputtering apparatus as claimed in claim 1, wherein said first gas-introducing means is operable to supply nitrogen gas.

5. The reactive sputtering apparatus as claimed in claim 1, wherein said second gas-introducing means is operable to supply argon gas.

6. The reactive sputtering apparatus as claimed in claim 1, wherein
   said magnets comprise a circular magnet and an annular magnet mounted coaxially about said circular magnet.

7. The reactive sputtering apparatus as claimed in claim 6, wherein
   said magnets are positioned vertically above said target; and
   said predetermined location of said at least one opening is vertically aligned with said portion of said magnetic field.

8. The reactive sputtering apparatus as claimed in claim 7, wherein
   said magnets comprise a circular magnet and an annular magnet mounted coaxially about said circular magnet.

9. The reactive sputtering apparatus as claimed in claim 1, wherein
   said at least one opening comprises a plurality of openings arranged in an annular pattern.

10. The reactive sputtering apparatus as claimed in claim 1, wherein
    said at least one opening comprises a single annular opening.

11. The reactive sputtering apparatus as claimed in claim 1, wherein
    said at least one opening comprises a pair of substantially semi-annular openings.

12. A reactive sputtering apparatus comprising:
    a vacuum chamber;
    a cathode fixed to an inner surface of the chamber;
    a power source for applying a voltage to the cathode;
    a magnetic circuit, installed in the cathode and having magnets, for generating a magnetic field;
    a target, installed adjacent the magnets, having at least one opening therethrough;
    a vacuum means for evacuating air form inside the chamber to obtain a vacuum;
    a first gas-introducing means, disposed at a wall of the chamber, for supplying reactive gas into the chamber;
    a second gas-introducing means for supplying discharge gas through said at least one opening of the target into the chamber;
    a first gas flow rate control means for controlling the supply of the reactive gas;
    a second gas flow rate control means for controlling the supply of the discharge gas;
    a substrate holder, disposed in opposition to the target inside the chamber, for securing a substrate thereto;
    wherein said cathode, said power source and said magnetic circuit together constitute a means for creating an erosion region, having a central maximum erosion portion, on said target; and
    wherein said at least one opening is formed through said target at a location thereof corresponding to said central maximum erosion portion of said erosion region.

13. The reactive sputtering apparatus as claimed in claim 12, wherein the target has a plurality of openings, each of which is at a location corresponding to said central maximum erosion portion of said erosion region.

14. The reactive sputtering apparatus as claimed in claim 12, wherein the magnets of the magnetic circuit are coaxial with one another.

15. The reactive sputtering apparatus as claimed in claim 12, wherein said first gas-introducing means is operable to supply nitrogen gas.

16. The reactive sputtering apparatus as claimed in claim 12, wherein said second gas-introducing means is operable to supply argon gas.

17. The reactive sputtering apparatus as claimed in claim 12, wherein
    said magnets comprise a circular magnet and an annular magnet mounted coaxially about said circular magnet.

18. The reactive sputtering apparatus as claimed in claim 12, wherein
    said at least one opening comprises a plurality of openings arranged in an annular pattern.

19. The reactive sputtering apparatus as claimed in claim 12, wherein
said at least one opening comprises a single annular opening.

20. The reactive sputtering apparatus as claimed in claim 12, wherein
said at least one opening comprises a pair of substantially semi-annular openings.

* * * * *